Sept. 23, 1969 H. W. VAN BEEK 3,469,155

PUNCH-THROUGH MEANS INTEGRATED WITH MOS TYPE DEVICES
FOR PROTECTION AGAINST INSULATION LAYER BREAKDOWN

Filed Sept. 23, 1966

INVENTOR
Herman W. van Beek
BY Gordon H. Telfer
ATTORNEY

United States Patent Office 3,469,155
Patented Sept. 23, 1969

3,469,155

PUNCH-THROUGH MEANS INTEGRATED WITH MOS TYPE DEVICES FOR PROTECTION AGAINST INSULATION LAYER BREAKDOWN

Herman W. van Beek, Laurel, Md., assignor to Westinghouse Electric Corporation, Pittsburgh, Pa., a corporation of Pennsylvania Filed Sept. 23, 1966, Ser. No. 581,580
Int. Cl. H01l *15/00, 13/00, 11/14*
U.S. Cl. 317—235 8 Claims

ABSTRACT OF THE DISCLOSURE

A protective element that turns on at a punch-through voltage less than the oxide breakdown voltage is connected to the gate electrode of an active MOS device to avoid destructive breakdown of the oxide layer.

This application is directed to semiconductor devices of the MOS type with means to provide protective for the insulating layer against destructive breakdown.

MOS transistors are finding increasing use but numerous devices are destroyed through electrical breakdown of the insulating layer often occurring merely due to accumulated static charges. Merely inserting such a device into a socket can cause sufficient static electricity to produce destructive breakdown. Similar destruction may occur in MOS capacitors.

The type of breakdown referred to may occur regardless of the nature of the insulating layer in the device. It may be of silicon dioxide, as is presently most commonly used, but it may also be another insulating layer such as other refractory oxides, nitrides or the like. As used herein, the expression "MOS transistor" or the like is used to designate any of the metal-insulating layer-semiconductor transistors regardless of the composition of the insulating layer.

One of the applications of interest for MOS type transistors is in switching networks for digital computers. In such instance, the type of device used is that called an enhancement mode device wherein the current between source and drain is negligible in the absence of a voltage applied to the gate electrode because the design of the device is such that no inversion layer occurs between the source and drain without applied potential. Using integrated circuit techniques large numbers of such devices can be simultaneously fabricated on a single body of semiconductive material and suitable interconnections provided between them. The high packaging density of MOS devices is one of their principal advantages. Each of the individual MOS switching devices is susceptible to destructive breakdown.

It is an object of the present invention to provide improved MOS type transistors wherein there is protection against the oxide, or other insulating layer, being inadvertently destroyed through electrical breakdown.

Another object is to provide improved enhancement mode MOS transistors that may be formed in arrays of large numbers, each of which can be protected against insulating layer breakdown without requiring undue amounts of semiconductive material.

The invention briefly achieves the above-mentioned and additional objects and advantages through the provision of a protective element in the same body of semiconductive material as that in which the MOS transistor to be protected is disposed. The protective element includes regions of which one is connected to the gate electrode of the MOS transistor. That region forms a p-n junction with the adjacent region, typically a common substrate with the protected element, at which a depletion layer is created by reason of any voltage appearing on the gate electrode, which depletion layer will punch through to another region having a predetermined spacing to the first at a voltage level below that at which breakdown of the insulating layer will occur.

The above, as well as additional objects and advantages of the present invention, will be better understood by referring to the following description taken with the accompanying drawing wherein.

Figure 1:
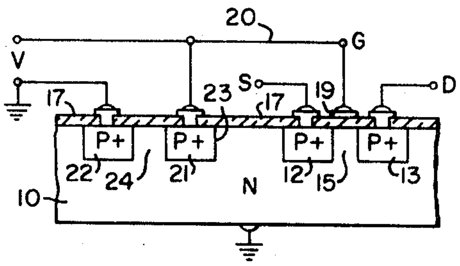
FIGURE 1 is a partial cross sectional view of a protected MOS transistor in accordance with the present invention.

In the structure of FIG. 1, the right-hand portion comprises a generally conventional MOS transistor including a first region 10, or substrate, of n-type conductivity in which second and third regions 12 and 13 of p+ conductivity to serve as source and drain regions are disposed. The source and drain regions 12 and 13 are spaced a distance defining a channel 15 over which is disposed a layer 17 of insulating material on which a gate electrode 19 is positioned.

This structure may, for example, be of silicon, with the source and drain regions formed by selective diffusion applying oxide passivation techniques wherein the oxide layer not only covers the channel but the remaining portion of the structure as well, except where contacts are desired. The gate electrode 19, as well as other contacts, may be formed by aluminum metalization.

In the structures of interest to this invention the resistivity of the n-type substrate 10 is sufficiently low that no p-type inversion layer occurs at its surface in the channel region 15 in the absence of a potential to the gate electrode 19.

The gate electrode 19 is connected by conductor 20 to a fourth region 21 of p+ conductivity disposed on the surface of the substrate that may be and preferably is like the source and drain regions 12 and 13. The fourth region 21 is spaced from another region 22 by a channel 24 that is of predetermined length so that upon application of potential or electrostatic charge formation on the gate electrode 19 a depletion layer at the junction 23 between the fourth and first regions will extend (punch through) to the additional region 22 prior to destructive breakdown of the oxide layer 17 and provide a path to ground (substrate 10) around the oxide layer 17. The additional region 22 is maintained at the same potential as the first region 10.

Figure 2:
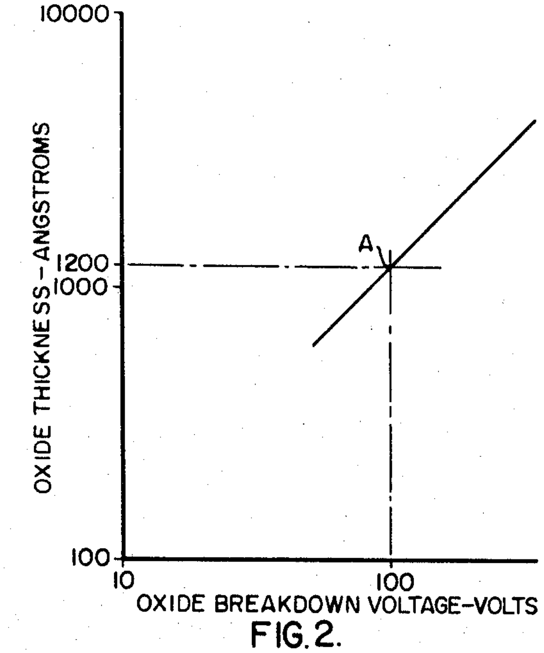
FIGS. 2 and 3 are graphs of data useful in the design of protected MOS transistors in accordance with this invention.
Figure 3:
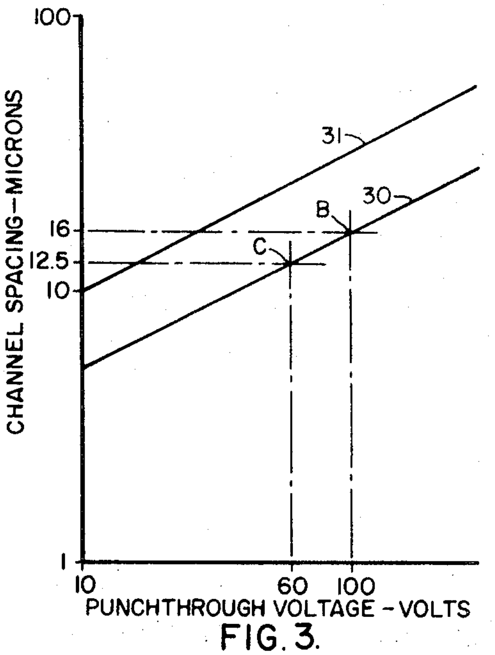

The rationale of the present invention will be better understood by referring to FIGS. 2 and 3. In FIG. 2 there is shown a graph of data exhibiting variation in breakdown voltage for silicon dioxide layers of various thicknesses. The layers were formed by passing for a certain length of time, oxygen ($O_2$) gas over the silicon wafer which was exposed to a high ambient temperature (e.g. 1150° C.). Similar data may, of course, be obtained for other insulating layers or formation techniques. Merely as an example, assume that a device fabrication process makes an oxide thickness of about 1200 angstroms desirable. FIG. 2 indicates at point A that the breakdown voltage of the silicon dioxide layer of 1200 angstroms thickness is about 100 volts. Thus, any buildup of charge that permits this voltage to develop across the oxide layer will result in its permanent destruction.

FIG. 3 shows how for semiconductive material of different resistivities, the punch-through voltage is related to the length of the protective element's channel 24. One curve 30 is for 10 ohm-centimeter n-type material and the other 31 is for 40 ohm-centimeter n-type material. This information determines the design of the protective element.

In order to provide punch-through below the hundred volt level at which oxide breakdown occurs, for example, in 10 ohm-centimeter n-type material, it is seen from FIG. 3, point B, that it is necessary that the channel spacing be less than about 16 microns. Since the active MOS elements are conveniently formed with a channel spacing about ½ mil or about 12.5 microns, it is likewise convenient that the channel of the protective element be of that length to provide a suitable margin for safety between the punch-through voltage and the oxide breakdown voltage for a 1200 angstrom layer. Thus, from FIG. 3, point C, it is seen that with a channel length of about 12.5 microns the punch-through voltage is about 60 volts, thus insuring that oxide breakdown will not occur. If desired, the same 12.5 micron channel may be used in instances in which the oxide layer is at least about 1000 angstroms.

The punch-through type of breakdown is, of course, non-destructive and is reproducible. Other types of breakdown are not as suitable as punch-through for the purpose of interest here. For example, if avalanche breakdown were relied on between the first and fourth regions to protect the oxide layer there would be much more careful design required and less freedom in providing an adequate margin of safety since the avalanche breakdown of a p-n junction may easily be about the same or greater than an oxide layer breakdown voltage.

In depletion type devices wherein the inversion layer in the channel occurs even in the absence of a potential applied to the gate electrode, the type of protection provided by the invention herein would not generally be desirable because there would always appear the shunt comprising the channel resistance of the protective element. As applied to enhancement mode devices, however, where no such inversion layer occurs, the path to ground is only formed at the times when it is necessary to protect the insulating layer.

The protective element occupies very little area and thus does not unduly increase the expense of forming a large element array of MOS switching elements. As noted, the channel spacing of the protective element may be about ½ mil. The channel width may be of about the same magnitude. In fact, it is desirable to minimize the channel width so as to reduce the junction capacitance of the protective element. Each of the active switching elements in a large array of MOS devices which connects to peripheral circuitry is susceptible to electrostatic charging and should preferably be provided in accordance with this invention with a protective element. Spikes in the supply voltage may so exceed the insulating layer breakdown voltage. In any application wherein a number of MOS transistors have their gates interconnected, they may be protected by a single protective element.

Figure 4:
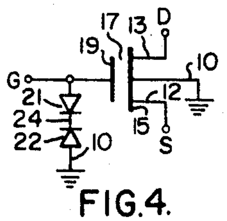
FIG. 4 is the approximate equivalent circuit of the structure of FIG. 1.

FIG. 4 illustrates the approximate equivalent circuit of the structure of FIG. 1 with the same reference numerals being used to identify corresponding elements. The protective element provides its function so long as the potentials applied to the gate are of the same polarity, in this example, negative with respect to the ground and susbtrate. Any positive signals will forward bias the junction. Of course, the conductivity type of the regions, and the required polarity, may be reversed.

Figure 5:
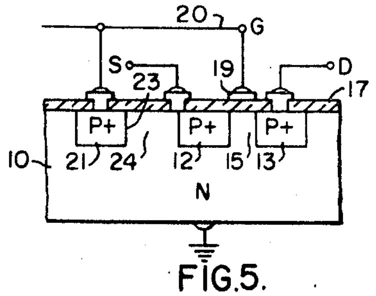
FIG. 5 is a partial sectional view of an alternative embodiments of the present invention.

FIG. 5 illustrates an alternative form of the invention, the same reference numerals being used to identify elements corresponding to those of FIG. 1. In many applications employing MOS transistors the source 12 is grounded with the substrate 10 as shown in FIG. 5. In such instances it is not necessary that a separate additional region (22, FIG. 1) be provided in the protective element to accomplish the punch-through function. The region 21 connected to the gate electrode 19 may be spaced an appropriate distance from the source region 12 to provide punch-through. In an embodiment such as those of FIG. 1 the two additional regions 21 and 22 of the protective element should be adequately spaced from the source and drain regions 12 and 13 so that punch-through to those regions does not occur. Embodiments as shown in FIG. 5, of course, further minimize the amount of semiconductive surface area required.

Figure 6:
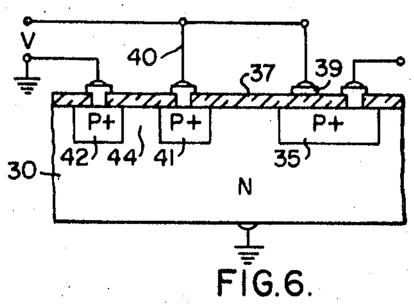

FIG. 6 illustrates another form of the invention utilizing the same concept as was discussed in connection with the previous figures. Here the protected element is an MOS-type capacitor not exhibiting transistor action. The capacitor comprises, in this example, a p+ region 35, an n-type substrate 30, insulating layer 37 and electrode 39. Insulating layer 37 is susceptible to breakdown in the same manner as layer 17 in FIGS. 1 and 5. The protective element comprises regions 41 and 42 spaced to define a channel 44 through which punch-through occurs prior to the breakdown of a layer 37. Region 41 is connected by conductor 40 to gate electrode 39. Region 42 is grounded, as is the substrate 30.

Similar to the arrangement shown in FIG. 5, if capacitor region 35 is grounded, it may be used for the punch-through effect with region 41 and not require region 42. In that case the desired channel length would be provided between regions 35 and 41.

While the present invention has been shown and described in a few forms only, it will be apparent that various changes and modifications may be made without departing from the spirit and scope thereof.

What is claimed is:

1. An MOS type device in an integrated array of MOS type devices with means to avoid destructive breakdown comprising: a body of semiconductive material including a substrate of a first conductivity type; a layer of insulating material covering at least a portion of a surface of said body, said layer of insulating material exhibiting destructive breakdown at a first voltage level; a layer of conductive material disposed on said layer of insulating material over said surface portion to serve as an electrode; an initial region of semiconductive material of a second conductivity type in said surface spaced from said portion; a conductive interconnection between said electrode and said initial region; said region being spaced from another region of said second conductivity type by a distance through material of said substrate of said first conductivity type to define a channel region exhibiting punch-through at a voltage level less than said voltage level, said channel region not being operated as part of an active MOS type device.

2. The subject matter of claim 1 wherein: said portion of a surface of said body is a semiconductor region of an MOS-type capacitor.

3. The subject matter of claim 1 wherein: said portion of a surface of said body is a channel region of an MOS-type transistor.

4. An MOS type transistor in an integrated array of MOS type transistors with means to avoid destructive breakdown comprising: a first region of semiconductive material of a first type conductivity; second and third regions of semiconductive material of a second type of conductivity in a surface of said first region to serve as source and drain regions, said second and third regions being spaced a distance to define a channel region therebetween; a layer of insulating material covering at least said channel region, said layer of insulating material exhibiting destructive breakdown at a first voltage level; a layer of conductive material disposed on said layer of insulating material over said channel region to serve as a gate electrode; a fourth region of semiconductive material of said second type in said surface; a conductive interconnection between said gate electrode and said fourth region; said fourth region being spaced from another region of the same type by a distance to define an additional channel region exhibiting punch-through at a voltage level less than said first voltage level and a voltage level less than that at which avalanche breakdown of the diode formed by said fourth and first regions occurs, said additional channel region not being operated as part of an active MOS type device.

5. The subject matter of claim 4 wherein: said another region is one of said second and third regions that has a direct interconnection to said first region.

6. The subject matter of claim 4 wherein: said another region is a fifth region that has a direct interconnection with said first region and said fourth and fifth regions are both spaced from said second and third regions by a distance greater than the spacing between said fourth and fifth regions.

7. The subject matter of claim 4 wherein: said channel region between said second and third regions is free of an inversion layer in the absence of a voltage on said gate electrodes.

8. The subject matter of claim 4 wherein: said second, third, fourth and said another region are all of the same resistivity, impurity concentration gradient and thickness.

References Cited

UNITED STATES PATENTS

| | | | |
|---|---|---|---|
| 3,230,429 | 1/1966 | Stehney | 317—235 |
| 3,264,493 | 8/1966 | Price | 307—88.5 |
| 3,272,989 | 9/1966 | Sekely | 307—88.5 |
| 3,289,093 | 11/1966 | Wanlass | 330—35 |
| 3,340,598 | 9/1967 | Hatcher | 29—571 |
| 3,356,858 | 12/1967 | Wanlass | 307—88.5 |
| 3,395,290 | 7/1968 | Farina et al. | 307—202 |
| 3,403,270 | 9/1968 | Pace et al. | 307—304 |
| 3,407,339 | 10/1968 | Booher | 317—33 |

JOHN W. HUCKERT, Primary Examiner

R. SANDLER, Assistant Examiner

U.S. Cl. X.R.

29—571

Notice of Adverse Decisions in Interferences

In Interference No. 97,388 involving Patent No. 3,469,155, H. W. Van Beek, PUNCH-THROUGH MEANS INTEGRATED WITH MOS TYPE DEVICES FOR PROTECTION AGAINST INSULATION LAYER BREAKDOWN, final judgment adverse to the patentee was rendered Dec. 29, 1972, as to claims 1–8.

[*Official Gazette May 22, 1973.*]